United States Patent
Sakai et al.

(10) Patent No.: US 6,524,958 B2
(45) Date of Patent: Feb. 25, 2003

(54) METHOD OF FORMING CHANNEL IN THIN FILM TRANSISTOR USING NON-IONIC EXCITED SPECIES

(75) Inventors: Masahiro Sakai, Neyagawa (JP); Masaharu Terauchi, Nara (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/986,269

(22) Filed: Nov. 8, 2001

(65) Prior Publication Data

US 2002/0055211 A1 May 9, 2002

(30) Foreign Application Priority Data

Nov. 8, 2000 (JP) ........................... 2000-339964

(51) Int. Cl.⁷ ............................................. H01L 21/302
(52) U.S. Cl. ....................................................... 438/689
(58) Field of Search ................................ 438/197, 689, 438/726, 774, 775

(56) References Cited

U.S. PATENT DOCUMENTS 5,760,420 A * 6/1998 Song ........................... 257/57
5,879,973 A * 3/1999 Yanai et al. ................. 438/161

FOREIGN PATENT DOCUMENTS

| JP | 62-047161 | 2/1987 |
| JP | 10-209151 | 8/1998 |
| JP | 11-008395 | 1/1999 |

OTHER PUBLICATIONS

"Plasma and fluorocarbon–gas free Si dry etching process using a Cat–DVD system." Akira Izumi et al., *Microelectric Engineering* 51–52 (2000), pp. 495–503.

"Plasma free dry etching of crystalline silicon using atomic hydrogen generated by hot catalyzer." Kenji Uchida et al., 2000 Dry Process Symposium, pp. 231–235.

"Back–channel oxidized α–Si–H thin–film transistors." Kazushige Takeuchi et al., Journal of Applied Physics, vol. 84, No. 7. Oct. 1, 1998, pp. 3993–3999.

* cited by examiner

Primary Examiner—David Nelms
Assistant Examiner—Thao P Le
(74) Attorney, Agent, or Firm—Parkhurst & Wendel, L.L.P.

(57) ABSTRACT

In the production of channel etch type bottom gate thin film transistors, etching damage in a channel etch step is prevented to improve the transistor performance. The channel etch is performed using non-ionic excited species, such as hydrogen radicals and fluorine radicals, generated by contact-decomposition reaction which utilizes a metal heated by electric resistance heating. Alternatively, in place of the channel etch, a portion of the source/drain semiconductor thin film immediately above the channel is nitrided by a non-ionic nitrogen-containing decomposition product that is produced by contacting molecules of a chemical substance containing nitrogen atoms with a metal heated by electric resistance heating to decompose the chemical molecules.

16 Claims, 7 Drawing Sheets

METHOD OF FORMING CHANNEL IN THIN FILM TRANSISTOR USING NON-IONIC EXCITED SPECIES

BACKGROUND OF THE INVENTION

1. Field of the Invention

The present invention relates to bottom gate thin film transistors (TFTs) for use in liquid crystal display (LCD) devices and organic electroluminescent display devices. The invention also relates to methods of producing the TFTs.

2. Description of the Prior Art

Hydrogenated amorphous silicon (a-Si:H) TFTs are widely utilized for switching elements in liquid crystal display devices since they can be accurately fabricated on inexpensive glass substrates by a low temperature process.

There are two types of structures for a-Si TFTs, a top gate structure and a bottom gate structure. The top gate structure has a drawback that the interface between an a-Si:H thin film, which is later formed into the channel, and a gate insulating film is often contaminated during the fabrication. In contrast, the bottom gate structure is advantageous in that, since the a-Si:H thin film and the gate insulating film are successively produced without being exposed to atmosphere, the performance of the TFTs is not degraded by the contamination and the electron mobility is larger than the top gate TFTs. Thus, for switching elements in liquid crystal display devices or the like, bottom gate TFTs are advantageous. Bottom gate TFTs have two major types, etch stopped type and channel etch type (also referred to as back channel etch type). Channel etch type TFTs require less photomasks in the fabrication process than etch stopped type TFTs. This makes channel etch type bottom gate TFTs advantageous in terms of manufacturing cost, and therefore, channel etch type bottom gate TFTs have increasingly been favored recently.

FIGS. 7A to 7F show the production process of a channel etch type bottom gate TFT, each of the cross sectional views illustrating a step of the production process. With reference to these figures, a fabrication procedure of a channel etch type bottom gate TFT is described below.

Figure 7A:
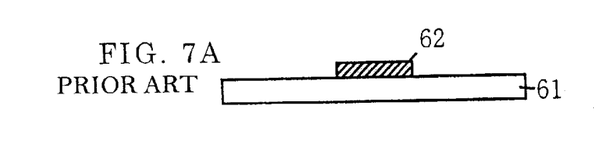
FIGS. 7A to 7F are schematic cross sectional views showing the steps of a prior art producing method of a bottom gate TFT.

A gate electrode 62 is deposited on an insulating substrate 61 to a thickness of 200 nm by sputtering and thereafter patterned into an island by photolithography and etching (FIG. 7A). Typically, the gate electrode 62 is made of an aluminum film, or a layered film made of an aluminum film and a film of a metal having a high melting point, such as titanium.

Figure 7B:
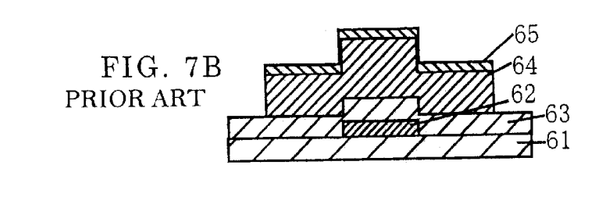

Subsequently, an $SiN_x$ film, which serves as a gate insulating film 63, is deposited to a thickness of 300 nm by plasma enhanced chemical vapor deposition (PECVD), and thereafter, without exposing the surface to atmosphere, an a-Si:H film, which serves as a high resistivity semiconductor film 64, is deposited to a thickness of 200 nm by PECVD. Then, an n+ a-Si:H film, which serves as a low resistivity semiconductor film 65, is deposited to a thickness of 20 nm by PECVD. Thereafter, stacked layers of the high resistivity semiconductor film 64 and the low resistivity semiconductor film 65 are processed into an island by photolithography and etching (FIG. 7B).

Figure 7C:
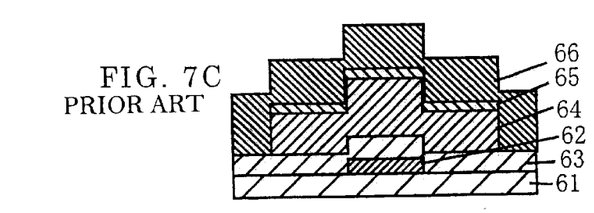
Figure 7D:
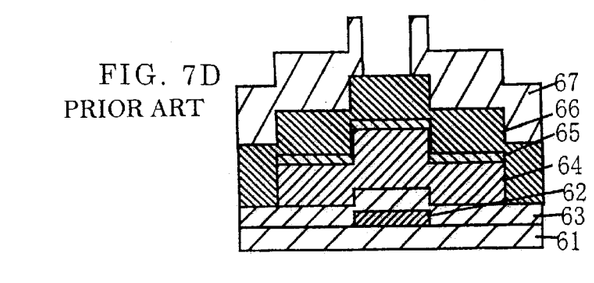
Figure 7E:
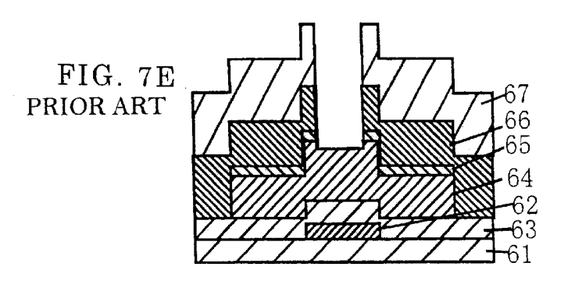

Subsequently, a source/drain electrode metal 66 is deposited by sputtering (FIG. 7C). Thereafter, a resist 67 is coated (FIG. 7D), and an opening is formed by photolithography and etching in a portion thereof which is located above the channel region. Thereafter, the low resistivity semiconductor film 65 is etched with the use of the same resist pattern to form a back channel (FIG. 7E).

This step is generally referred to as a channel etch step.

Figure 7F:
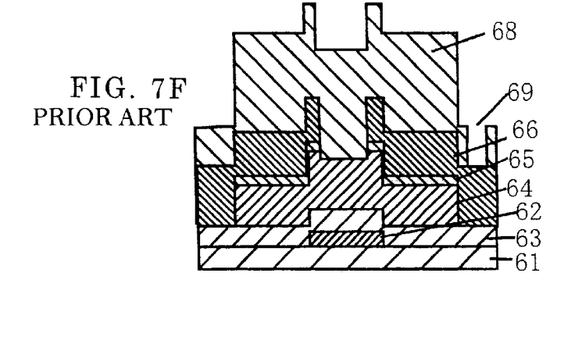

Subsequently, in order to protect the back channel exposed by the etching, a silicon nitride film serving as a passivation film 68 is deposited to a thickness of 300 nm by CVD. Finally, an opening 69 for connecting a pixel electrode is opened in a predetermined position in the passivation film 68 by photolithography and etching. Thus, a TFT is completed.

SUMMARY OF THE INVENTION

However, the foregoing prior art method has at least the following problems. In the prior art method, due to the fact that the etching selective ratio between the low resistivity semiconductor film 65 and the high resistivity semiconductor film 64 is small, overetch is caused in the channel etch step and thereby the high resistivity semiconductor film 64 is considerably etched in addition to the low resistivity semiconductor film 65 (FIG. 7E). When such overetch occurs, hydrogen in the back channel, which is composed of an a-Si:H film, is lost, and etching damage is caused by which the film uniformity with respect to the vertical orientation of the film is degraded. The etching damage deteriorates various TFT characteristics. For example, the field effect mobility of the TFT decreases to about half.

To reduce the etching damage to the back channel, if the film thickness of the high resistivity semiconductor film 64 is in the time required for the film deposition correspondingly increase reducing efficiency in production. On the other hand, if the deposition rate is increased and the deposition time is thereby reduced, film quality is degraded. In other words, both of the approaches have problems; the former increases fabrication cost due to an increase in production tact time, whereas the latter degrades production yields and TFT characteristics. Therefore, the prior art method cannot achieve efficient production of bottom gate TFTs which sufficiently function in high resolution display devices in which moving pictures are displayed.

Accordingly, it is a first object of the present invention to provide a method of producing a bottom gate TFT that solves the foregoing and other problems in the prior art. It is a second object of the invention to provide a liquid crystal display device and an organic electroluminescent display device to which the manufacturing method of the invention is applied. These and other objects are accomplished, in accordance with the present invention, by the following embodiments which include a range of aspects.

Embodiment 1

According to a first aspect of the invention, there is provided a method of producing a bottom gate thin film transistor, comprising the steps of:

forming a gate electrode on an insulating substrate;

forming a gate insulating film over the gate electrode;

forming a first semiconductor thin film for a channel over the gate insulating film;

forming a second semiconductor thin film for a source and a drain over the first semiconductor thin film;

processing stacked layers of the first semiconductor thin film and the second semiconductor thin film so as to be formed into an island;

subsequent to the step of processing stacked layers, depositing a source/drain electrode metal over the stacked layers of the first semiconductor thin film and the second semiconductor thin film;

etching a region of the deposited source/drain electrode metal, the region being located above the channel, in the depth direction to expose the second semiconductor thin film, whereby a source electrode and a drain electrode are formed; and etching away the exposed portion of the second semiconductor thin film in the depth direction with the use of a non-ionic excited species to form a channel.

In this fabrication method, non-ionic excited species are used in the etching of the second semiconductor thin film for the source and drain (so-called channel etch). The use of non-ionic excited species reduces etching damage to the back channel because the excited species are not accelerated by electric field. Therefore, the production yield increases, and reliability in product quality of the produced channel etch bottom gate TFTs remarkably improves.

According to a second aspect of the invention, the fabrication method of the first aspect may be such that the non-ionic excited species is generated by bringing molecules of a chemical substance into contact with a metal heated by electric resistance heating to decompose the molecules of the chemical substance.

This fabrication method utilizes a catalytic CVD technique and makes it possible to produce a large amount of non-ionic excited species with simple equipment. In addition, in this method (contact-decomposition reaction method), few ionic excited species are generated. It is noted that the molecules of the chemical substrate herein are meant to include molecules composed of a single element, such as $H_2$ molecules.

According to a third aspect of the invention, the method of the second aspect may be such that the non-ionic excited species is a radical.

In non-ionic excited species, radicals have large energy. Accordingly, good etching efficiency can be obtained. Therefore, the use of radicals is preferable.

According to a fourth aspect of the invention, the method of the third aspect may be such that the metal is selected from the group consisting of tungsten, tantalum, molybdenum, vanadium, platinum, and thorium, or is an alloy comprising at least two metals selected from the group consisting of tungsten, tantalum, molybdenum, vanadium, platinum, and thorium.

These metals function as catalysts in the contact-decomposition reaction. These metals are preferable because they have high melting points and can be heated by electric resistance heating. Of these metals, tungsten is particularly preferable. This is because tungsten has the highest melting point among all the metals, and therefore hydrogen gas can be very efficiently decomposed into radicals. Further, even if evaporated tungsten contaminates the silicon semiconductor, the characteristics of the TFTs are not degraded seriously insofar as the amount of the contaminant is little.

According to a fifth aspect of the invention, the method of the fourth aspect may further comprise, subsequent to the step of etching away the exposed portion of the second semiconductor thin film, forming a passivation film comprising a silicon nitride film in such a manner that the etched surface is not exposed to atmosphere.

When the surface of the channel is exposed to atmosphere, the surface contamination occurs, which causes the degradation of TFT characteristics. For this reason, it is preferable that the surface of the channel be protected by a passivation film so as not to be exposed to atmosphere. In the present invention, the channel etch may be performed by using a contact-decomposition reaction apparatus that can also be utilized for the formation of the passivation film. Thereby, the passivation film can be successively formed subsequent to the channel etch, and therefore the above-described method can be easily realized.

According to a sixth aspect of the invention, the method of the fifth aspect may be such that the first semiconductor thin film is a thin film comprising silicon; and the second semiconductor thin film is a thin film comprising silicon and an n-type impurity.

When the channel etch using an excited species is employed for a semiconductor employing a silicon thin film or a silicon thin film which contains an n-type impurity, the advantageous effects achievable by the present invention are more saliently exhibited. It is to be noted, however, that the present invention is not limited to the use of these semiconductor films. For example, a silicon-germanium thin film may also be used.

According to a seventh aspect of the invention, the method of the sixth aspect may be such that the silicon comprises amorphous silicon or polycrystalline silicon.

According to an eighth aspect of the invention, the method of the first aspect may be such that the non-ionic excited species is a non-ionic radical.

According to a ninth aspect of the invention, the method of the first aspect may further comprise, subsequent to the step of etching away the exposed portion of the second semiconductor thin film, forming a passivation film composed of a silicon nitride film in such a manner that the etched surface is not exposed to atmosphere.

According to a tenth aspect of the invention, the method of the second aspect may be such that the metal is selected from the group consisting of tungsten, tantalum, molybdenum, vanadium, platinum, and thorium, or is an alloy comprising at least two metals selected from the group consisting of tungsten, tantalum, molybdenum, vanadium, platinum, and thorium.

According to an 11th aspect of the invention, the method of the third aspect may be such that the molecules of the chemical substance comprise hydrogen, ammonia, or a mixture thereof.

These substances are easily decomposed and produce radicals when they make contact with a metal heated by electric resistance heating. Therefore, these substances are advantageous to efficiently perform channel etch.

According to a 12th aspect of the invention, the method of the third aspect may be such that the non-ionic radical is a hydrogen radical.

Hydrogen radicals do not etch such metals as aluminum (Al) and titanium (Ti) and therefore, the source/drain electrode metal made of Al, Ti, or the like can be utilized as a mask in the channel etch. For this reason, the above-described method is advantageous for increasing productivity in TFT fabrication. It is noted here that a technique of utilizing the source/drain electrode metal as a mask is disclosed in Japanese Examined Patent Publication No. 6-30397. This technique employs $CH_4$ or $NF_3$ for the etching gas and Cr for the source/drain electrode metal. The reason for the use of Cr is that, when a metal other than Cr is used for the source/drain electrode, the source/drain electrode is damaged by $CH_4$ or $NF_3$. The above-described method, on the other hand, employs hydrogen radicals, and therefore Ti and Al are usable for the source/drain electrode metal.

According to a 13th aspect of the invention, the method of the third aspect may be such that the non-ionic radical is a halogen radical.

The use of halogen radical is preferable in that, even when a native oxide film is present on the surface of the silicon thin film, which is a semiconductor thin film, halogen radicals are capable of easily etching the native oxide film. Therefore, the etching uniformity for silicon does not degrade.

According to a 14th aspect of the invention, the method of the 13th aspect may be such that the non-ionic halogen radical is a fluorine radical.

Fluorine radicals are desirable in that, for example, a desirable selective ratio is relatively easily obtained between metals, such as the ones used for the source/drain metal, and silicon, which forms the semiconductor thin film.

According to a 15th aspect of the invention, the method of the first aspect may be such that the step of etching is such that the excited species is generated in a microwave plasma generating chamber provided in isolation from an etching chamber in which the etching is performed, and from the generated excited species, only non-ionic excited species are selected and introduced into the etching chamber.

The excited species that are generated by a plasma generating apparatus contain ionic excited species, and the ionic excited species are accelerated by a direct current electric field component generated in the plasma generating apparatus. Therefore, when a plasma that contains ionic excited species is used for the channel etch, etching damage is caused to the channel. In the above-described method, however, only non-ionic excited species are selected to be used in the channel etch, and accordingly, the excited species are not accelerated by the direct current electric field component. Thus, etching damage is reduced.

According to a 16th aspect of the invention, the method of the 15th aspect may be such that the selected non-ionic excited species is a non-ionic radical.

According to a 17th aspect of the invention, the method of the 15th aspect may further comprise, subsequent to the step of etching away the exposed portion of the second semiconductor thin film, forming a passivation film comprising a silicon nitride film in such a manner that the etched surface is not exposed to atmosphere.

When the etched surface is exposed to atmosphere, the characteristics of the transistors are degraded by the contamination of the exposed surface. The above-described method prevents the surface from contamination, thereby improving production yields and reliability in product quality.

Embodiment 2

According to an 18th aspect of the invention, there is provided a method of producing a bottom gate thin film transistor, comprising the steps of:

forming a gate electrode on an insulating substrate;
forming a gate insulating film over the gate electrode;
forming a first semiconductor thin film for a channel over the gate insulating film;
forming a second semiconductor thin film for a source and a drain over the first semiconductor thin film;
processing stacked layers of the first semiconductor thin film and the second semiconductor thin film into an island;
subsequent to the step of processing stacked layers, depositing a source/drain electrode metal over the stacked layers;
etching a region of the deposited source/drain electrode metal, the region being located above the channel, in the depth direction to expose the second semiconductor thin film, whereby a source electrode and a drain electrode are formed; and
nitriding the exposed portion of the second semiconductor thin film using a non-ionic nitrogen-containing decomposition product that is produced by decomposing molecules of a chemical substance containing nitrogen atoms.

In the above-described method, a portion (nitrided region) of the second semiconductor thin film that is overlaid immediately above the channel is nitrided using a non-ionic nitrogen-containing decomposition product that is produced by decomposing the molecules of a chemical substance containing nitrogen atoms. In the nitriding step of the above-described method, unnecessary nitriding of the first semiconductor thin film for the channel, which lies below the second semiconductor thin film, is avoided, and only the region to be nitrided in the second semiconductor film is accurately nitrided. Therefore, good transistor characteristics are achieved. Moreover, the channel, which is formed in a layer below the nitrided region at the same time as the formation of the nitrided region, is protected by the nitrided film which is layered thereover without being exposed to atmosphere. Thus, the above-described method remarkably improves reliability and stability of TFTs.

Japanese Patent No. 3191745 discloses a method in which channel oxidizing or channel nitriding is used in place of a channel etch step of the bottom gate TFTs. More specifically, this publication discloses a method in which an amorphous silicon film made into an n-type is exposed in a plasma containing one of a) oxygen ions, b) both oxygen ions and nitrogen ions, and c) nitrogen radicals, to modify the n-type amorphous silicon film into an insulating film of an oxynitrided film. However, it is known that in cases where the active layer is made of a-Si:H, the use of oxidizing degrades the transistor characteristics below the threshold voltage. Therefore, nitriding is advantageous over oxidizing. Nevertheless, the nitriding technique described in the foregoing publication uses a plasma, and for this reason, this technique cannot obtain sufficient rate of nitriding. Moreover, a plasma contains a ionic decomposition product. The ionic decomposition product is accelerated by electric field and collides with the semiconductor film. Thereby, the silicon film placed underneath the n-type amorphous silicon film is damaged, and consequently, the transistor characteristics are degraded. In contrast, the above-described method of the present invention uses a non-ionic nitrogen-containing decomposition product, and therefore, damage to the back channel is little. Hence, the above-described method achieves stable transistor characteristics.

According to a 19th aspect of the invention, the method of the 18th aspect may be such that the non-ionic nitrogen-containing decomposition product is generated by bringing a metal heated by electric resistance heating into contact with the molecules of the chemical substance containing nitrogen atoms.

This method achieves efficient generation of the non-ionic nitrogen-containing decomposition product and thereby improves productivity.

According to a 20th aspect of the invention, the method of the 19th aspect may be such that the molecules of the chemical substance comprise ammonia.

When the molecules of the chemical substance comprise ammonia, the non-ionic nitrogen-containing decomposition product is efficiently generated by contact-decomposition reaction with the metal heated by electric resistance heating. As a result, the nitriding proceeds swiftly.

According to a 21st aspect of the invention, the method of the 19th aspect may be such that the metal is selected from the group consisting of tungsten, tantalum, molybdenum, vanadium, platinum, and thorium, or is an alloy comprising at least two metals selected from the group consisting of tungsten, tantalum, molybdenum, vanadium, platinum, and thorium.

These metals function as an excellent catalyst for the contact-decomposition reaction. These metals are preferable because they have high melting points and can be heated by electric resistance heating. Of these metals, tungsten is particularly preferable. This is because tungsten has the highest melting point among all the metals, and therefore, the molecules of the chemical substance containing nitrogen atoms are very efficiently decomposed into radicals. Further, even if evaporated tungsten contaminates the silicon semiconductor, the characteristics of the TFTs are not degraded seriously insofar as the amount of the contaminant is little.

According to a 22nd aspect of the invention, the method of the 19th aspect may be such that the first semiconductor thin film is a thin film comprising silicon; and the second semiconductor thin film is a thin film comprising silicon and an n-type impurity.

It is preferable that the channel nitriding using the non-ionic nitrogen-containing decomposition product is applied to a semiconductor film comprising silicon, because the advantageous effects achievable by the present invention are thereby more saliently exhibited.

According to a 23rd aspect of the invention, the method of the 22nd aspect may be such that the silicon comprises amorphous silicon or polycrystalline silicon.

The channel nitriding using the non-ionic nitrogen-containing decomposition product exhibits more salient advantageous effects when applied to a silicon thin film comprising amorphous silicon or polycrystalline silicon.

Embodiment 3

According to a 24th aspect of the invention, there is provided a bottom gate thin film transistor comprising:

a gate electrode formed on an insulating substrate;

a gate insulating film formed over the gate electrode;

a channel region comprising a first semiconductor thin film stacked over the gate insulating film;

a source region and a drain region each comprising a second semiconductor thin film that is stacked over a region of the first semiconductor thin film exclusive of the channel region;

a source electrode and a drain electrode formed on the second semiconductor thin film; and a passivation film composed of a silicon nitride film formed on the channel;

wherein a portion of the channel contains at least one element selected from the group consisting of tungsten, tantalum, molybdenum, vanadium, platinum, and thorium, the portion of the channel being adjacent to a surface thereof which is in contact with the silicon nitride film, and the total atomic density of the at least one element is in the range of from $1\times10^{16} \cdot cm^{-3}$ to $1\times10^{19} \cdot cm^{-3}$.

The present inventors have found that when non-ionic excited species such as radicals are generated, the metal heated by electric resistance heating is evaporated and the evaporated metal, though in a trace amount, contaminates the first semiconductor thin film, which forms the channel. However, the present inventors have also found that when the metal is at least a metal selected from the group of tungsten, tantalum, molybdenum, vanadium, platinum, and thorium, adverse effects of the contaminant on transistor characteristics are negligible insofar as the amount of the contaminant is an atomic density of from $1\times10^{16} \cdot cm^{-3}$ to $1\times10^{19} \cdot cm^{-3}$. Based on these findings, the above-described method of the invention was thus accomplished.

According to a 25th aspect of the invention, the bottom gate thin film transistor of the 22nd aspect may be such that the first semiconductor thin film is a thin film comprising silicon; and the second semiconductor thin film is a thin film comprising silicon and an n-type impurity.

According to a 26th aspect of the invention, the bottom gate thin film transistor of the 25th aspect may be such that the silicon comprises amorphous silicon or polycrystalline silicon.

Embodiment 4

According to a 27th aspect of the invention, there is provided a bottom gate thin film transistor comprising:

a gate electrode formed on an insulating substrate;

a gate insulating film formed over the gate electrode;

a channel formed of a first semiconductor thin film stacked over the gate insulating film;

a source and a drain each formed of a second semiconductor thin film stacked over the first semiconductor thin film;

a nitrided region in which a portion of the second semiconductor thin film disposed immediately above the channel is nitrided; and a source electrode and a drain electrode, each formed on a portion of the second semiconductor thin film exclusive of the nitrided region;

wherein a portion of the channel contains at least one element selected from the group consisting of tungsten, tantalum, molybdenum, vanadium, platinum, and thorium, the portion of the channel being adjacent to a surface thereof which faces the nitrided region; and the total atomic density of the at least one element is in the range of from $1\times10^{16} \cdot cm^{-3}$ to $1\times10^{19} \cdot cm^{-3}$.

According to a 28th aspect of the invention, the bottom gate thin film transistor of the 27th aspect may be such that the first semiconductor thin film is a thin film comprising silicon; and the second semiconductor thin film is a thin film comprising silicon and an n-type impurity.

According to a 29th aspect of the invention, the bottom gate thin film transistor of the 28th aspect may be such that the silicon comprises amorphous silicon or polycrystalline silicon.

Embodiment 5

According to a 30th aspect of the invention, there is provided a liquid crystal display device comprising:

a first substrate comprising a plurality of scan electrodes, a plurality of data electrodes intersecting the scan electrodes, a plurality of thin film transistors provided at the intersectional positions of the scan electrodes and the data electrodes so that at least one of the plurality of thin film transistors is provided at each of the intersectional positions, and a plurality of pixel electrodes connected to the thin film transistors;

a second substrate comprising a counter electrode opposed to the pixel electrodes; and a liquid crystal sandwiched between the first substrate and the second substrate;

wherein each of the thin film transistors is a bottom gate thin film transistor according to any one of the foregoing 24th to 29th aspects of the invention.

Any of the bottom gate thin film transistors described in the above 24th to 29th aspects of the invention sufficiently exhibit the characteristics when used for the TFTs in a liquid crystal display device. Therefore, the above-described configuration achieves a liquid crystal display device that is excellent in terms of stable operation.

Embodiment 6

According to a 31 aspect of the invention, there is provided an organic electroluminescent display device comprising:

a first substrate comprising a plurality of scan electrodes, a plurality of data electrodes intersecting the scan electrodes, a plurality of thin film transistors provided at the intersectional positions of the scan electrodes and the data electrodes so that at least one of the thin film transistors is provided at each of the intersectional positions, and a plurality of pixel electrodes connected to the thin film transistors;

a second substrate comprising a counter electrode opposed to the pixel electrodes; and layer comprising an organic electroluminescent material, the lay being sandwiched between the first substrate and the second substrate;

wherein each of the thin film transistors is a bottom gate thin film transistor according to any one of th e foregoing 24th to 29th aspects of the invention.

Any of the bottom gate thin film transistors described in the above 24th to 29th aspects of the invention sufficiently exhibit the characteristics when used for switching elements in an organic electroluminescent display device. Therefore, the above-described configuration achieves an organic electroluminescent display device that is excellent in terms of stable operation.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Now, preferred embodiments of bottom gate TFTs and methods of producing the TFTs are discussed with reference to specific examples. In the examples below, a-Si:H is used for the high resistivity semiconductor film, and n-type a-Si:H doped with phosphorus is used for the low resistivity semiconductor film. It is to be understood, however, that the description is for illustrative purposes only. The semiconductor films may be formed of, for example, polycrystalline silicon (including microcrystalline silicon), amorphous silicon germanium, polycrystalline silicon germanium. It is also noted that the high resistivity semiconductor film is also referred to herein as a first semiconductor thin film or a semiconductor thin film for a channel, and the low resistivity semiconductor film is also referred to herein as a second semiconductor thin film or a semiconductor thin film for a source/drain.

EXAMPLE 1

Example 1 pertains to a method of producing a bottom gate TFT, the method employing a channel etch step utilizing hydrogen radicals. Referring to FIGS. 1A to 1G, the details of the method of Example 1 are presented below.

Figure 1A:
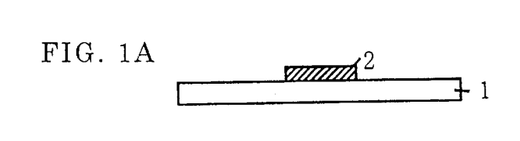
FIGS. 1A to 1G are schematic cross sectional views showing the steps of a producing method of a bottom gate TFT according to Example 1.

First, a gate electrode metal is deposited on an insulating substrate to a thickness of 200 nm by sputtering and is then processed into an island by photolithography and etching to form a gate electrode 2 (FIG. 1A). The gate electrode metal may be, for example, aluminum or a layered film composed of aluminum and a metal having a high melting point, such as titanium.

Figure 1B:
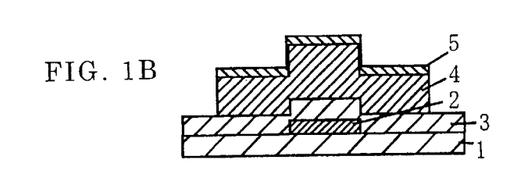

Subsequently, an $SiN_x$ film, which serves as a gate insulating film 3, is deposited to a thickness of 300 nm by CVD. Thereafter, an a-Si:H film, which serves as a high resistivity semiconductor film 4 and later forms a channel layer, is deposited to a thickness of 200 nm by CVD. Thereafter, an n+ a-Si:H film, which serves as a low resistivity semiconductor film 5, is deposited to a thickness of 20 nm by CVD. Then, by photolithography and etching, the stacked layers of the high resistivity semiconductor film 4 and the low resistivity semiconductor film 5 are processed into an island (FIG. 1B).

Figure 1C:
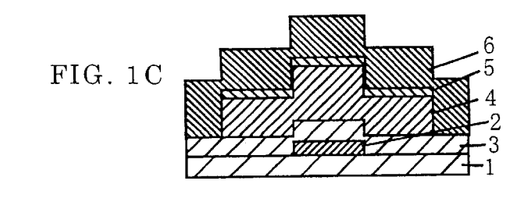
Figure 1D:
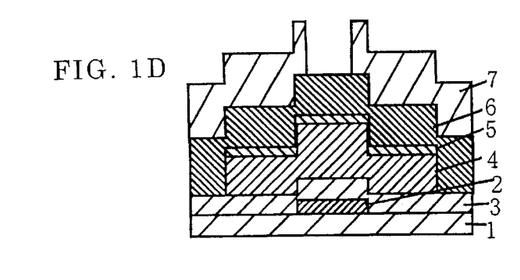
Figure 1E:
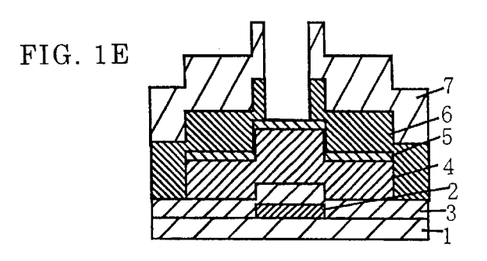

Subsequently, a source/drain electrode metal 6 is deposited by sputtering (FIG. 1C). The source/drain electrode metal is, for example, an aluminum film or a layered film composed of aluminum and a metal having a high melting point, such as titanium.

Subsequent to this, a photoresist 7 is formed over the source/drain electrode metal 6 (FIG. 1D), and an opening is formed by photolithography and etching in a portion thereof which is above the channel region. In this etching step, the low resistivity semiconductor film 5 is not etched.

Figure 1F:
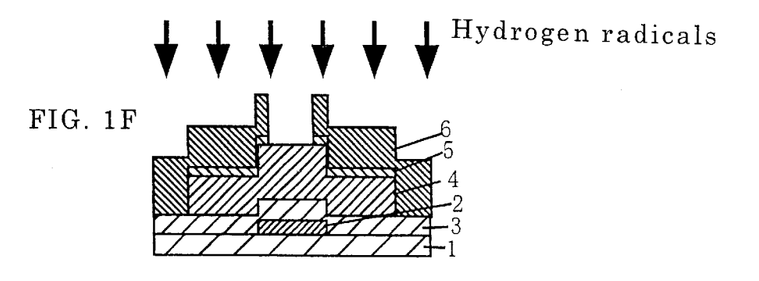
Figure 2:
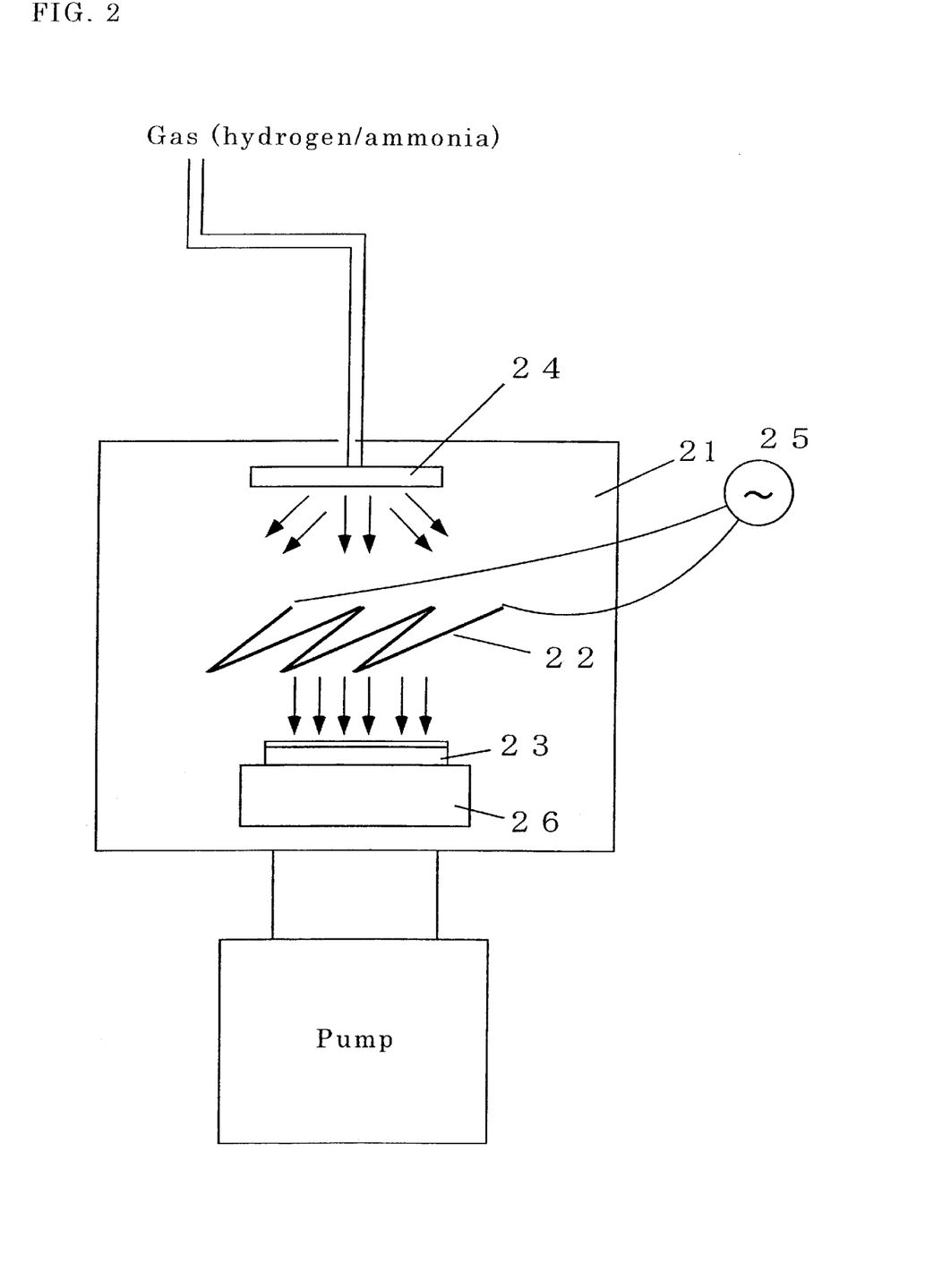
FIG. 2 is a schematic view showing an etching and nitriding apparatus used in Examples 1 and 2.

Subsequently, the photoresist 7 is removed, and using the, source electrode and the drain electrode which have been formed into predetermined shapes as a mask, the low resistivity semiconductor film 5 is etched with the use of hydrogen radicals. In this step of etching the low resistivity semiconductor film etching apparatus of FIG. 2 is used. A back channel is thus formed (FIG. 1F). This step is later described in further detail.

Figure 1G:
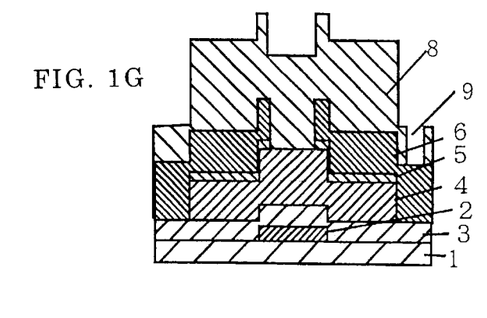
Figure 3:
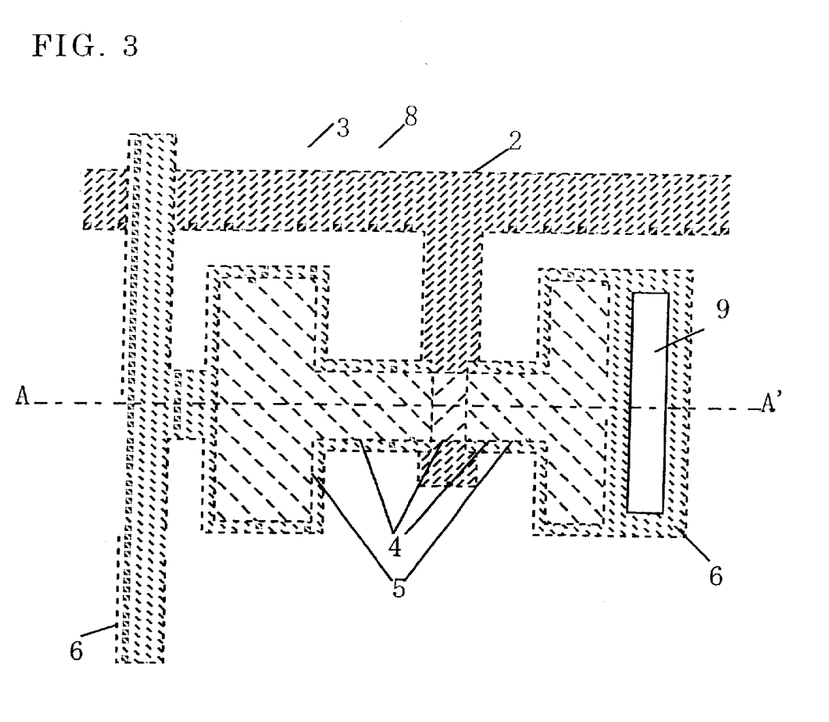
FIG. 3 is a schematic plan view showing the bottom gate TFT according to Example 1.

Following the formation of the channel, using the apparatus of FIG. 2, a passivation film 8 formed of a silicon nitride film is formed over the substrate surface by CVD so as to have a film thickness of 300 nm. Thereafter, as shown in FIG. 1G, in a predetermined portion thereof, an opening is formed by photolithography and etching. This opening 9 is used for connecting a pixel electrode therethrough. Thus, a bottom gate TFT of Example 1 is completed. A schematic plan view of the TFT thus fabricated is illustrated in FIG. 3. Note that FIG. 1G shows a cross sectional view taken along the line A–A' in FIG. 3.

Now, the etching step using non-ionic hydrogen radicals, the etching step which utilizes the above-mentioned etching apparatus, is discussed in detail. FIG. 2 shows a schematic view of the etching apparatus used for making the TFT of Example 1.

As shown in FIG. 2, first, a substrate 23 which has been subjected to the steps shown in FIGS. 1A to 1E is placed on a substrate heater 26, which also serves as a table. Thereafter, a vacuum chamber 21 is evacuated using a vacuum pump. Thereafter, by the substrate heater 26, the substrate 23 is heated to 250° C., for example, and simultaneously, electricity is supplied from an external power supply 25 to a metal wire 22 composed of a tungsten wire having a diameter of about 0.2 to 0.8 mm Φ D so as to heat the metal wire 22 to about 1400° C. to about 2100° C. In this state, hydrogen, for example, is introduced from a gas inlet 24 into the vacuum chamber 21 to produce a hydrogen gas atmosphere at a relatively low pressure, at about 10 Pa. Thereby, the hydrogen gas in the vacuum chamber 21 makes contact with the metal wire 22 and causes a contact-decomposition reaction, thereby producing non-ionic hydrogen radicals. The hydrogen radicals collide with the substrate 23 due to their molecular motion and thereby etch the portion of the low resistivity semiconductor film which is not covered by the source/drain electrode 6 (FIG. 1F). Thereby a back channel is formed.

The etching rate in the above-described etching step can be varied by varying such conditions as temperature of the metal heating wire, substrate temperature, gas pressure in the chamber, distance between the metal heating wire and the substrate, and so forth. By properly setting these conditions, a high quality channel which suffers little from etching damage is formed at high efficiency. The present inventors have confirmed that even when the etching rate is 200 nm/min or greater, high quality TFTs are fabricated with uniform TFT characteristics.

It has been described that hydrogen is used for the source of excited species in the above-described channel etch step, but the source of excited species (molecules of a chemical substance) is not limited to hydrogen. Other examples usable therefor include ammonia, $N_2H_4$, water vapor, and a gas mixture of these elements.

This example has illustrated a case wherein hydrogen radicals are used for the channel etch, but it is to be understood that the present invention is not limited thereto. For example, halogen radicals such as fluorine radicals may be employed in place of hydrogen radicals. For the source of fluorine radicals (molecules of a chemical substance), $NF_3$ and $CF_4$ may be used, for example.

The excited species used in the channel etch step may not be radicals insofar as the excited species are non-ionic excited species. Non-ionic excited species are not accelerated by a self-bias and, consequently, little etching damage is caused.

If the back channel formed by the etching as described above is exposed to atmosphere, the surface thereof is contaminated and thereby the characteristics of the TFT are degraded. In view of this, it is preferable that the deposition of the passivation film 8 be successively carried out immediately after the formation of the back channel. In consideration of this, the above-described etching apparatus can also be utilized as a catalytic CVD apparatus, making it possible to successively carry out the formation of the passivation film 8 immediately after the formation of the back channel. Thus, by the method of the present Example, a bottom gate TFT is achieved in which contamination of the back channel surface is prevented.

The excited species such as hydrogen radicals can be generated by producing radio-frequency plasma in a hydrogen gas atmosphere at a pressure of about 100 Pa, for example. However, this method produces ionic excited species as well. The ionic excited species are undesirable in that they are accelerated by the direct-current component generated by radio-frequency plasma (i.e., a self-bias) and consequently cause so-called etching damage to the high resistivity semiconductor film, which lies below the low resistivity semiconductor film. The excited species generated by the above-described etching apparatus are, on the contrary, non-ionic excited species. Furthermore, due to the fact that the metal heating wire 22 is used for generating excited species, little self-bias is generated. Therefore, etching damage is remarkably reduced. Accordingly, it is preferable to use excited species generated by contacting gaseous molecules of, for example, hydrogen gas (such molecules are referred to as "molecules of a chemical substance" herein) with a metal wire heated by electric resistance heating to decompose the molecules.

Figure 5:
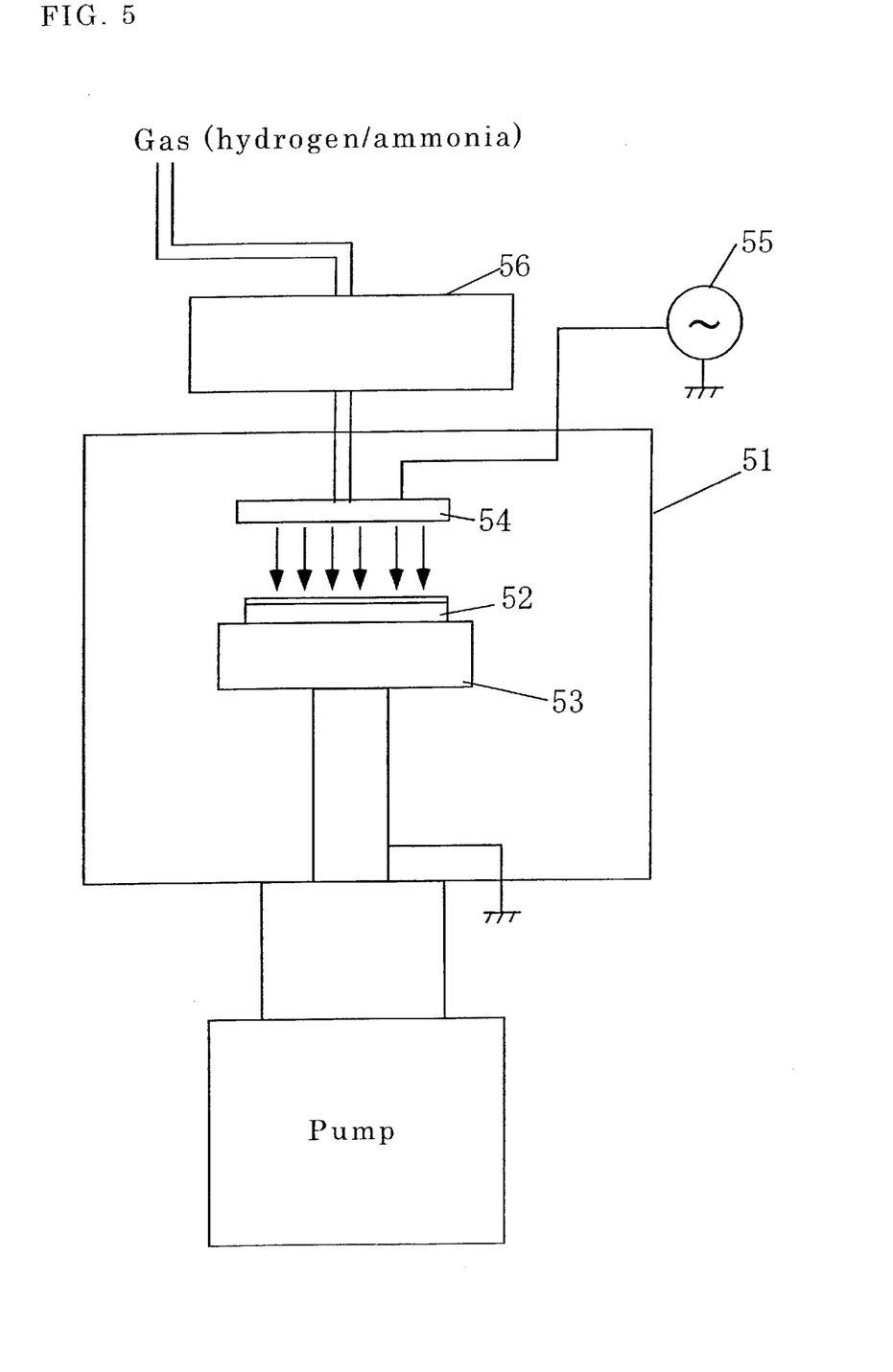
FIG. 5 is a schematic view showing another example of an etching and nitriding apparatus usable for Examples 1 and 2.

It is to be understood, however, that, in the present invention, the excited species generated by radio frequency plasma may also be used. If this is the case, it is necessary to employ a so-called remote plasma system. In the remote plasma system, an apparatus other than the above-described etching apparatus, for example, a microwave plasma apparatus or the like, is used to generate excited species. Then, among the generated excited species, only the non-ionic excited species are selected by, for example, guiding the generated excited species through a mesh electrode to which a bias is applied, and then the non-ionic excited species are guided into the above-described etching apparatus for an etching step. FIG. 5 shows an apparatus for such a remote plasma system.

Illustrated in FIG. 5 are a radio frequency plasma generating chamber 56 and a gas inlet 54 also serving as an upper electrode, in which a mesh electrode for removing ionic excited species is incorporated. FIG. 5 also shows a chamber 51, a substrate heater 53 also serving as a lower electrode, and a high frequency electrode 55.

EXAMPLE 2

Example 2 shows a method of producing TFTs that includes, in place of the channel etch step in Example 1, a step of nitriding a portion (nitrided region) of the low resistivity semiconductor film that is located immediately above the portion of the high resistivity semiconductor film that later forms the channel with the use of nitride radicals or active $NH_x$, where x is in the range of 1 to 3.

Figure 4A:
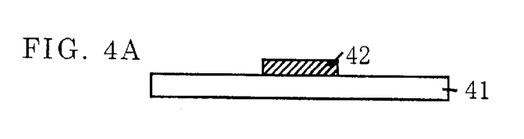
FIGS. 4A to 4G are schematic cross sectional views showing the steps of a producing method of a bottom gate TFT according to Example 2.
Figure 4B:
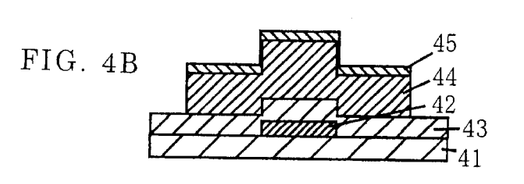
Figure 4C:
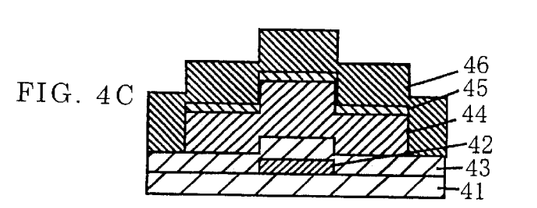
Figure 4D:
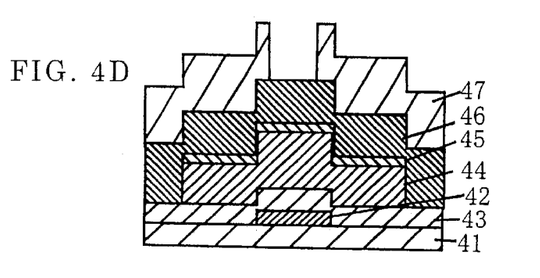
Figure 4E:
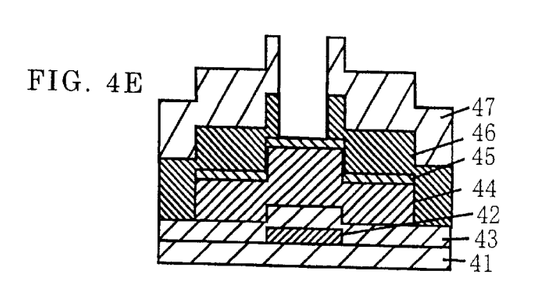

FIGS. 4A to 4G show cross sectional views each of which shows a step of the producing method of Example 2. The steps shown in FIGS. 4A through 4E are similar to those in the foregoing Example 1 above and therefore not further elaborated upon. The steps to be carried out subsequent to the step of FIG. 4E are described below.

Figure 4F:
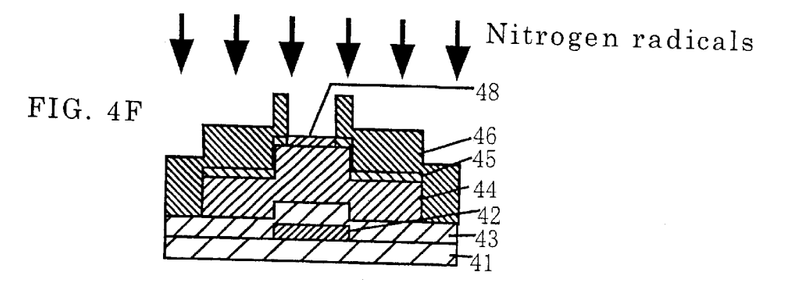
Figure 4G:
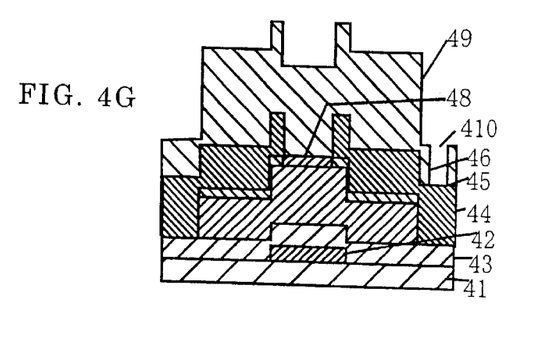

The channel etch step of Example 2 also uses the apparatus of FIG. 2, and the procedure is basically the same as that in the foregoing Example 1. Specifically, first, a substrate which has been subjected to the steps shown in FIGS. 4A to 4E is placed on the substrate heater 26, which also serves as a table. Thereafter, the vacuum chamber 21 is evacuated using a vacuum pump. Thereafter, by the substrate heater 26, the substrate 23 is heated to 300° C., for example, and simultaneously, electricity is supplied from an external power supply 25 to the metal wire 22 composed of a tungsten wire having a diameter of about 0.2 to 0.8 mm Φ so as to heat the metal wire 22 to about 1000° C. to about 1800° C. In this state, ammonia is introduced from a gas inlet 24 into the vacuum chamber 21 to produce an ammonia gas atmosphere at a relatively low pressure, at about 10 Pa. Thereby, the ammonia gas (i.e., molecules of a chemical substance) in the vacuum chamber 21 makes contact with the metal wire 22 and causes a contact-decomposition reaction, thereby producing a non-ionic decomposed product (nitrogen radicals or $NH_x$, where x is in the range of 1 to 2). The non-ionic decomposed product collides with the substrate 23 and thereby nitrides the portion of the low resistivity semiconductor film which is not covered by the source/drain electrode 6 (FIG. 4F). Thereby a nitride film (also referred to as "nitrided region" herein) is formed, and a channel is formed therebelow.

Like Example 1, few ionic excited species are generated in this method, and therefore, according to the above-described method, the channel is free from the damage that is caused by the excited species being accelerated by the self-bias. Furthermore, the channel is protected by the nitrided film 48 so as not to be in contact with atmosphere. Accordingly, highly reliable TFTs are produced with little variation in TFT characteristics.

The substrate temperature is set at about 300° C. because at about 300° C., nitriding proceeds smoothly. The temperature of the metal wire 22 is set in the range of from about 1000° C. to about 1800° C. because this temperature range is preferable in that the etching that is caused by the hydrogen radicals generated by ammonia ($NH_3$) does not easily occur, and the nitriding occurs predominantly.

It has been described that ammonia is used for the source of the non-ionic decomposed product. However, the source of the non-ionic decomposed product is not limited to ammonia but various other chemical compounds may be used insofar as nitrogen atoms are contained therein. It is preferable that molecules of a chemical substance be easily decomposed by contacting. An example of such a chemical compound is $N_2H_4$.

The rate of nitriding can be adjusted by varying such conditions as temperature of the metal wire, substrate temperature, gas pressure, and distance between the metal wire and the substrate.

In FIG. 2, the metal wire 22 is shown as an example of the metal for the contact-decomposition reaction, but the shape of the catalytic metal is not limited thereto. Plate-like shapes and coil-like shapes may be employed (this also applies to the foregoing Example 1).

Illustrated in FIGS. 4A to 4G are a substrate 41, a gate electrode metal 42, a gate insulating film 43, a high resistivity semiconductor thin film 44, a low resistivity semiconductor thin film 45, source/drain electrodes 46, a resist 47, a nitrided region 48, a passivation film 49, and an opening 410.

The Relationship Between the Catalytic Metal and TFT Characteristics

It has been described in the foregoing Examples 1 and 2 that tungsten is used as a catalytic metal in the contact-decomposition reaction, but the catalytic metal usable in the present invention is not limited to tungsten. The present inventors have confirmed in experiments that similar effects are obtained when the catalytic metal is tungsten, molybdenum, tantalum, vanadium, platinum, thorium, or an alloy made from at least two of these metals. In the experiments, it has been found that when the contact-decomposition reaction which uses a metal heated by electric resistance heating (catalytic metal) is applied to a channel etch, the catalytic metal contaminates the channel, though the amount of the contaminant is very little. It is thought that even if the heating is carried out at a temperature lower than the melting point, evaporation of the metal occurs and the evaporated metal contaminates the semiconductor layer. In view of this problem, the present inventors have carried out further research and as a result found the following.

(1) The amount of the catalytic metal that contaminates the TFT channel greatly varies, depending on various conditions such as types of catalytic metals, temperature of heating, processing time for the channel etch, density of the oxygen remaining in the chamber, and so forth.

(2) When conditions are the same, the use of tungsten as a catalytic metal can reduce the amount of the metal that contaminates the channel. The reason is believed to be that tungsten has the highest melting point among all the metals and a low vapor pressure.

(3) The amount of the catalytic metal that contaminated the channel was an atomic density of $10^{16} \cdot cm^{-3}$ under the following conditions: tungsten was used as the catalytic metal, the temperature of the metal was 1800° C., the processing time for the channel etch was about 1 minute, the partial pressure of hydrogen was 10 Pa, and the partial pressure of oxygen in the chamber (the amount of remaining oxygen) was sufficiently low (about $10^{-4}$ Pa or lower). When the partial pressure of oxygen in the chamber (the amount of remaining oxygen) was higher (about $10^{-2}$ Pa) and the rest of the conditions are the same, the amount was an atomic density of $10^{19} \cdot cm^{-3}$. Thus, the density of the remaining oxygen in the chamber greatly affects the amount of the contamination, and the reason is believed to be that the melting point of metal decreases when the metal becomes an oxide and therefore, the oxidized metal tends to be more easily evaporated.

(4) It has also been found that even when the density of the remaining oxygen is low, an increase in temperature of the catalytic metal increases the amount of the contaminant. For example, when the temperature of the catalytic metal was 2100° C. and the processing time was 1 minute, the amount of tungsten, the contaminant, was an atomic density of $10^{19} \cdot cm^{-3}$. However, it has been confirmed that the TFT in which tungsten is contained at an atomic density of $10^{19} \cdot cm^{-3}$ in the channel made of a silicon thin film sufficiently functions as a transistor. Tungsten is a particularly preferable catalytic metal for the electric resistance heating because it does not form a deep level in silicon, and therefore, the probability of carrier disappearance does not greatly vary.

EXAMPLE 3

The TFTs made in accordance with the foregoing Example 1 are formed on an insulating substrate so that they are arranged in a matrix configuration. Pixel electrodes are then formed to be connected to the respective drain electrodes, and using the TFTs, a liquid crystal display device was produced in a known manner. It was confirmed that when video signal was inputted to the liquid crystal display device to operate the, TFTs, the switching operation of each of the pixels was accurate in comparison with cases where TFTs made in accordance with the prior art methods, and that as a consequence, good display images were obtained.

EXAMPLE 4

In a similar manner to the foregoing Example 3, a liquid crystal display device was produced using the TFTs made in accordance with Example 2. Video signal was inputted into the liquid crystal display device thus produced to operate the TFTs. As a result, it was confirmed that stable switching operation was obtained.

EXAMPLE 5

Organic electroluminescent display devices were produced using the TFTs made in accordance with the foregoing Examples 1 and 2. As in the cases of the liquid crystal display devices, it was found that stable display performance was obtained in comparison with cases of the devices using the TFTs made in accordance with the prior art methods.

Figure 6:
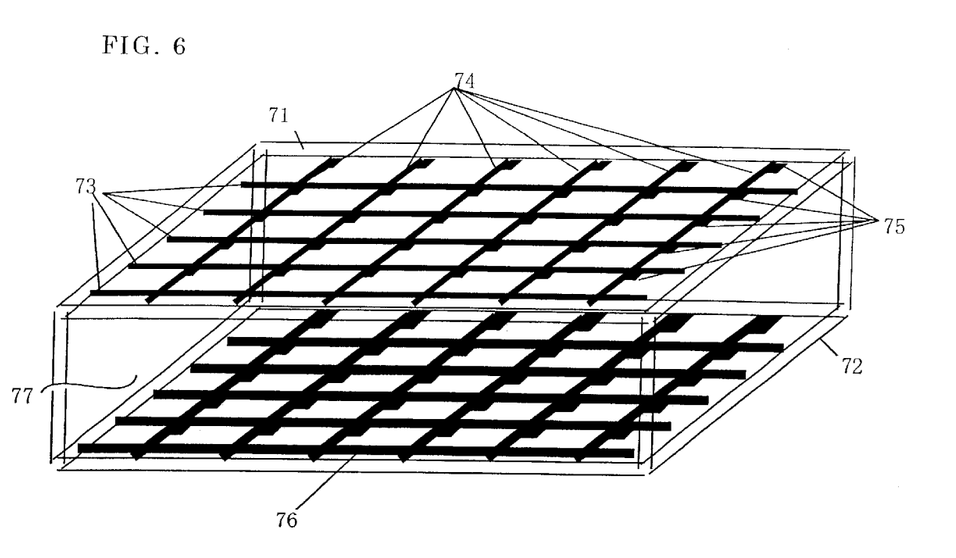
FIG. 6 is a perspective view showing the general construction of display devices of Examples 3 to 5.

FIG. 6 shows a basic structure of the display devices of Examples 3 to 5. Illustrated in FIG. 6 are an array substrate 71, a counter substrate 72, gate electrode lines 73, source electrode lines 74, thin film transistors 75, and a black matrix 76. The reference numeral 77 represents a liquid crystal material or an organic electroluminescent material.

As has been described thus far, the bottom gate TFTs and the methods of producing the TFTs according to the present invention achieve a remarkable reduction of etching damage in the channel etch step. In addition, back channel is prevented from the contamination that is caused by the exposure of the back channel to atmosphere, leading to an improvement in TFT characteristics and consequently an increase in the production yield. Moreover, due to the improvement of TFT characteristics, a high resolution display device with a large screen size is realized. Furthermore, the reductions of the contamination and of the damage to the back channel lead to further advantages. That is, even when the thickness of the a-Si:H film is reduced, the TFT characteristics do not degrade. As a consequence, further advantageous effects are obtained such as a reduction in the deposition time for the a-Si:H film and an extension of a cleaning cycle of the CVD chamber, which results in a reduction in the production tact time.

Although the present invention has been fully described by way of examples with reference to the accompanying drawings, it is to be noted that various changes and modifications will be apparent to those skilled in the art. Therefore, unless such changes and modifications depart from the spirit and scope of the present invention defined by the appended claims, they should be construed as being included therein.

What is claimed is:

1. A method of producing a bottom gate thin film transistor, comprising:

forming a gate electrode on an insulating substrate;

forming a gate insulating film over the gate electrode;

forming a first semiconductor thin film having a channel therein over the gate insulating film;

forming a second semiconductor thin film for a source and a drain over the first semiconductor thin film;

forming the stacked layers of the first semiconductor thin film and the second semiconductor thin film into an island;

subsequent to said forming stacked layers into an island, depositing a source/drain electrode metal over the stacked layers of the first semiconductor thin film and the second semiconductor thin film;

etching a region of the deposited source/drain electrode metal, the region being located above the channel, in the depth direction to expose the second semiconductor thin film, whereby a source electrode and a drain electrode are formed; and etching away the exposed portion of the second semiconductor thin film in the depth direction with the use of a non-ionic excited species to form a channel, the non-ionic excited species being generated by bringing molecules of a chemical substance into contact with a metal heated by electric resistance heating to decompose the molecules of the chemical substance.

2. The method according to claim 1, wherein the non-ionic excited species is a radical.

3. The method according to claim 2, wherein the metal is selected from the group consisting of tungsten, tantalum, molybdenum, vanadium, platinum, and thorium, or is an alloy comprising at least two metals selected from the group consisting of tungsten, tantalum, molybdenum, vanadium, platinum, and thorium.

4. The method according to claim 3, further comprising, subsequent to etching away the exposed portion of the second semiconductor thin film, forming a passivation film comprising a silicon nitride film so that the etched surface is not exposed to atmosphere.

5. The method according to claim 4, wherein the first semiconductor thin film is a thin film comprising silicon; and the second semiconductor thin film is a thin film comprising silicon and an n-type impurity.

6. The method according to claim 5, wherein the silicon comprises amorphous silicon or polycrystalline silicon.

7. The method according to claim 1, wherein the metal is selected from the group consisting of tungsten, tantalum, molybdenum, vanadium, platinum, and thorium, or is an alloy comprising at least two metals selected from the group consisting of tungsten, tantalum, molybdenum, vanadium, platinum, and thorium.

8. The method according to claim 2, wherein the molecules of the chemical substance comprise hydrogen, ammonia, or a mixture thereof.

9. The method according to claim 2, wherein the non-ionic radical is a hydrogen radical.

10. The method according to claim 2, wherein the non-ionic radical is a halogen radical.

11. The method according to claim 10, wherein the non-ionic halogen radical is a fluorine radical.

12. A method of producing a bottom gate thin film transistor, comprising:

forming a gate electrode on an insulating substrate;

forming a gate insulating film over the gate electrode;

forming a first semiconductor thin film having a channel therein over the gate insulating film;

forming a second semiconductor thin film for a source and a drain over the first semiconductor thin film;

forming the stacked layers of the first semiconductor thin film and the second semiconductor thin film into an island;

subsequent to said forming stacked layers, depositing a source/drain electrode metal over the stacked layers;

etching a region of the deposited source/drain electrode metal, the region being located above the channel, in the depth direction to expose the second semiconductor thin film, whereby a source electrode and a drain electrode are formed; and nitriding the exposed portion of the second semiconductor thin film to form a channel using a non-ionic nitrogen-containing decomposition product that is generated by bringing a metal heated by electric resistance heating into contact with molecules of the chemical substance containing nitrogen atoms.

13. The method according to claim 12, wherein the molecules of the chemical substance comprise ammonia.

14. The method according to claim 12, wherein the metal is selected from the group consisting of tungsten, tantalum, molybdenum, vanadium, platinum, and thorium, or is an alloy comprising at least two metals selected from the group consisting of tungsten, tantalum, molybdenum, vanadium, platinum, and thorium.

15. The method according to claim 12, wherein the first semiconductor thin film is a thin film comprising silicon, and the second semiconductor thin film is a thin film comprising silicon and an n-type impurity.

16. The method according to claim 15, wherein the silicon comprises amorphous silicon or polycrystalline silicon.

* * * * *